US011967506B2

(12) United States Patent
Hattori et al.

(10) Patent No.: US 11,967,506 B2
(45) Date of Patent: Apr. 23, 2024

(54) GRINDING APPARATUS

(71) Applicant: DISCO CORPORATION, Tokyo (JP)

(72) Inventors: Mato Hattori, Tokyo (JP); Ichiro Yamahata, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 42 days.

(21) Appl. No.: 17/649,625

(22) Filed: Feb. 1, 2022

(65) Prior Publication Data

US 2022/0262641 A1 Aug. 18, 2022

(30) Foreign Application Priority Data

Feb. 12, 2021 (JP) .................................. 2021-020558

(51) Int. Cl.
*H01L 21/304* (2006.01)
*B24B 27/00* (2006.01)
(Continued)

(52) U.S. Cl.
CPC ........ *H01L 21/304* (2013.01); *B24B 27/0076* (2013.01); *B24B 37/042* (2013.01); *B24B 47/22* (2013.01)

(58) Field of Classification Search
CPC ....... B24B 7/228; B24B 7/04; B24B 27/0076; B24B 37/30; B24B 37/04; B24B 37/07;
(Continued)

(56) References Cited

U.S. PATENT DOCUMENTS

| 7,022,000 B2 * | 4/2006 | Mizomoto | ............ B24B 37/345 451/65 |
| 8,657,648 B2 * | 2/2014 | Yamanaka | ............ H01L 21/304 451/333 |
| 9,616,544 B2 * | 4/2017 | Ito | ........................ G06T 7/0004 |

FOREIGN PATENT DOCUMENTS

| CN | 105390413 A | * | 3/2016 | ............ H01L 21/30 |
| JP | 2000288881 A | * | 10/2000 | |

(Continued)

OTHER PUBLICATIONS

Machine translation of JP-2000288881-A (Year: 2000).*
(Continued)

*Primary Examiner* — Bryan R Muller
*Assistant Examiner* — Robert F Neibaur
(74) *Attorney, Agent, or Firm* — GREER BURNS & CRAIN, LTD.

(57) ABSTRACT

A grinding apparatus includes a first grinding mechanism, a second grinding mechanism, and a third grinding mechanism for grinding wafers held on respective chuck tables. The first grinding mechanism and the second grinding mechanism are positioned with respect to the chuck tables such that a second ground mark produced on a wafer by second grindstones of the second grinding mechanism as it grinds the wafer extends across a first ground mark produced on the wafer by first grindstones of the first grinding mechanism as it grinds the wafer. The second grinding mechanism and the third grinding mechanism are positioned with respect to the chuck tables such that a third ground mark produced on the wafer by third grindstones of the third grinding mechanism as it grinds the wafer extends across the second ground mark produced on the wafer by the second grindstones.

17 Claims, 5 Drawing Sheets

(51) Int. Cl.
*B24B 37/04* (2012.01)
*B24B 47/22* (2006.01)

(58) Field of Classification Search
CPC ..... B24B 37/10; B24B 37/107; B24B 41/047;
B24B 49/02–06
USPC ......... 451/41, 287, 290, 294, 285, 385, 398,
451/402, 413
See application file for complete search history.

(56) References Cited

FOREIGN PATENT DOCUMENTS

| | | | | |
|---|---|---|---|---|
| JP | 2000288881 A | | 10/2000 | |
| JP | 2006294855 A | * | 10/2006 | |
| JP | 2010194680 A | * | 9/2010 | ........... B24B 19/028 |

OTHER PUBLICATIONS

Machine translation of JP-2006294855-A (Year: 2006).*
Machine translation of JP-2010194680-A (Year: 2010).*
Machine translation of CN-105390413-A (Year: 2016).*

* cited by examiner

GRINDING APPARATUS

BACKGROUND OF THE INVENTION

Field of the Invention

The present invention relates to a grinding apparatus.

Description of the Related Art

A grinding apparatus for grinding a wafer held on the holding surface of a chuck table with grindstones is disclosed in Japanese Patent Laid-open No. 2000-288881, for example. The disclosed grinding apparatus includes a first grinding mechanism and a second grinding mechanism. The grinding apparatus operates to grind a workpiece such that a mark produced on the workpiece when it is ground by first grindstones mounted in the first grinding mechanism and a mark produced on the workpiece when it is ground by second grindstones mounted in the second grinding mechanism extend across each other.

SUMMARY OF THE INVENTION

However, in case a grinding apparatus includes three or more grinding mechanisms, it is difficult for the grinding apparatus to grind a workpiece such that a mark produced on the workpiece when it is ground early by one of the grinding mechanisms and marks produced on the workpiece when it is ground later by another one of the grinding mechanisms extend across each other.

It is therefore an object of the present invention to provide a grinding apparatus having three or more grinding mechanisms that operate to grind a workpiece such that marks produced on the workpiece respectively by the grinding mechanisms extend appropriately across each other.

In accordance with an aspect of the present invention, there is provided a grinding apparatus for grinding a wafer, including at least four chuck tables for holding respective wafers on holding surfaces thereof, a first grinding mechanism for grinding the wafer held on the holding surface of one of the chuck tables by keeping lower surfaces of first grindstones arranged in an annular array in contact with a radial area of the wafer, a second grinding mechanism for grinding the wafer held on the holding surface of one of the chuck tables by keeping lower surfaces of second grindstones arranged in an annular array in contact with a radial area of the wafer, a third grinding mechanism for grinding the wafer held on the holding surface of one of the chuck tables by keeping lower surfaces of third grindstones arranged in an annular array in contact with a radial area of the wafer, a first grinding feed mechanism for grinding-feeding the first grinding mechanism in a grinding feed direction perpendicular to the holding surface of one of the chuck tables, a second grinding feed mechanism for grinding-feeding the second grinding mechanism in a grinding feed direction perpendicular to the holding surface of one of the chuck tables, a third grinding feed mechanism for grinding-feeding the third grinding mechanism in a grinding feed direction perpendicular to the holding surface of one of the chuck tables, and a turntable with the chuck tables mounted thereon, the turntable being rotatable about its central axis for positioning the chuck tables respectively with respect to the first grindstones, the second grindstones, and the third grindstones, in which the first grinding mechanism and the second grinding mechanism are positioned with respect to the chuck tables such that a second ground mark produced on the wafer by the second grindstones when the wafer is ground by the second grindstones extends across a first ground mark produced on the wafer by the first grindstones when the wafer is ground by the first grindstones, and in which the second grinding mechanism and the third grinding mechanism are positioned with respect to the chuck tables such that a third ground mark produced on the wafer by the third grindstones when the wafer is ground by the third grindstones extends across the second ground mark produced on the wafer by the second grindstones.

In the grinding apparatus according to the aspect of the present invention, the first grinding mechanism, the second grinding mechanism, and the third grinding mechanism are positioned with respect to the chuck tables such that the second ground mark on the wafer extends across the first ground mark on the wafer and the third ground mark on the wafer extends across the second ground mark on the wafer. The wafer is ground by the second grindstones so as to scrape off the first ground mark. The wafer is ground by the third grindstones so as to scrape off the second ground mark. Consequently, the wafer that is thus ground is of high quality as it has small thickness variations and high flexural strength.

Furthermore, since appropriate impact forces act on the second grindstones and the third grindstones as they grind the wafer, the second grindstones and the third grindstones are dressed on their own, i.e., self-dressed, and maintain and increase their grinding capability.

The above and other objects, features and advantages of the present invention and the manner of realizing them will become more apparent, and the invention itself will best be understood from a study of the following description and appended claim with reference to the attached drawings showing a preferred embodiment of the invention.

DETAILED DESCRIPTION OF THE PREFERRED EMBODIMENT

A grinding apparatus according to a preferred embodiment of the present invention will be described hereinbelow with reference to the accompanying drawings. In the drawings, the grinding apparatus is illustrated in relation to an X-axis, a Y-axis perpendicular to the X-axis, and a Z-axis perpendicular to the X-axis and the Y-axis. The X-axis and the Y-axis extend horizontally and the Z-axis vertically. The opposite directions along the X-axis will be referred to as a +X direction and a −X direction. The opposite directions along the Y-axis will be referred to as a +Y direction and a −Y direction. The opposite directions along the Z-axis will be referred to as a +Z direction and a −Z direction.

Figure 1:
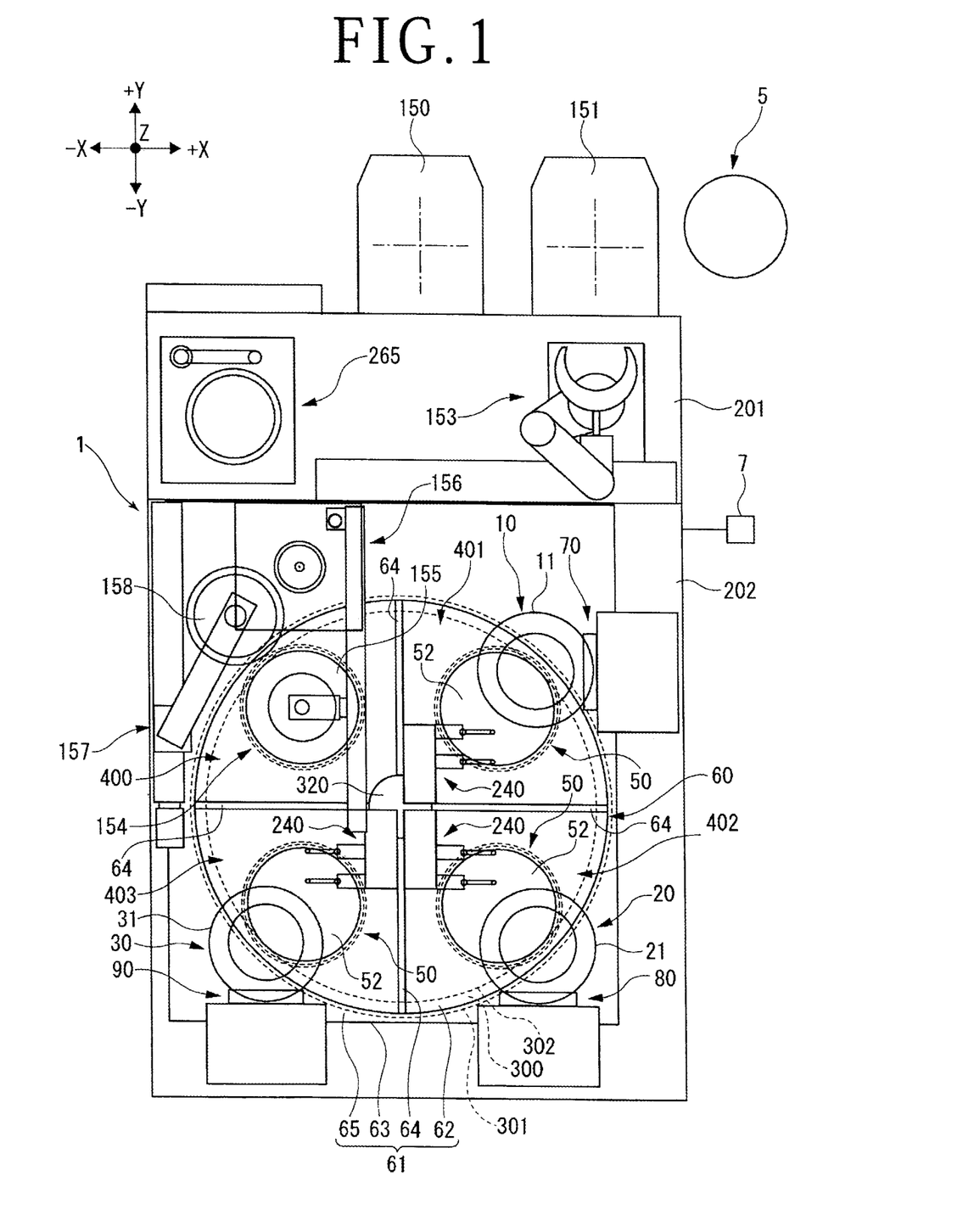
FIG. 1 is a plan view illustrating structural details of a grinding apparatus according to an embodiment of the present invention.

As illustrated in FIG. 1, the grinding apparatus, denoted by 1, has a first apparatus base 201 and a second apparatus base 202 disposed on one side of the first apparatus base 201 that faces in the −Y direction. Wafers 5 to be processed, i.e., ground, by the grinding apparatus 1 are loaded and unloaded over the first apparatus base 201, and are processed over the second apparatus base 202.

The grinding apparatus 1 has a control unit 7, and also includes a first grinding mechanism 10, a second grinding mechanism 20, and a third grinding mechanism 30 on the second apparatus base 202. The control unit 7 controls the first grinding mechanism 10, the second grinding mechanism 20, and the third grinding mechanism 30 to grind wafers 5 held on a plurality of (four in the present embodiment) chuck tables 50 on the second apparatus base 202.

The grinding apparatus 1 includes a first cassette 150 and a second cassette 151 that are disposed on a front side of the first apparatus base 201 that faces in the +Y direction. The first cassette 150 and the second cassette 151 house wafers 5 to be processed and wafers 5 that have been processed. According to the present embodiment, wafers 5 to be processed are housed in the first cassette 150 whereas wafers 5 that have been processed are housed in the second cassette 151.

The first cassette 150 and the second cassette 151 have respective openings, not illustrated, that are open in the −Y direction. A robot 153 is mounted on the first apparatus base 201 on the side of these openings in the first cassette 150 and the second cassette 151 that faces in the −Y direction. The robot 153 loads processed wafers 5 one at a time into the second cassette 151. The robot 153 also unloads wafers 5 to be processed one at a time from the first cassette 150 and carries them one at a time onto a temporary rest table 156 where they are temporarily placed.

A loading mechanism 154 is mounted on a side area of the second apparatus base 202 in the −X direction. The loading mechanism 154 includes a loading pad 155 for holding a wafer 5. The loading pad 155 holds a wafer 5 placed on the temporary rest table 156 and delivers the wafer 5 to one of the chuck tables 50. An unloading mechanism 157 is also mounted on the second apparatus base 202 in the vicinity of the loading mechanism 154.

Each of the chuck tables 50 has a porous holding surface 52 for holding a wafer 5 thereon. The holding surface 52 includes an upwardly convex conical surface having a vertex at its center, and is held in fluid communication with a suction source, not illustrated. The suction source applies a negative pressure to the holding surface 52 to hold the wafer 5 under suction thereon.

Each of the chuck tables 50 holds a wafer 5 delivered by the loading mechanism 154 on the holding surface 52. The chuck table 50 is rotatable about a rotational axis extending vertically along the Z-axis through the center of the holding surface 52 to rotate the holding surface 52 with the wafer 5 held thereon.

According to the present embodiment, the four chuck tables 50 are disposed in circumferentially spaced positions at equal angular intervals on an upper surface of a turntable 60 disposed on the second apparatus base 202. The turntable 60 is rotatable about its central axis on the second apparatus base 202. Specifically, the turntable 60 is rotatable about its central axis extending along the Z-axis by a turntable motor, not illustrated. The turntable 60 and the turntable motor are operatively coupled to each other by an endless belt trained around an outer side wall surface of the turntable 60 and a pulley mounted on the tip end of the output shaft of the turntable motor. When the turntable 60 is rotated about its central axis, the four chuck tables 50 are rotated about the central axis of the turntable 60. Upon rotation of the turntable 60, each of the chuck tables 50 can be positioned successively in a loading and unloading area 400 near the loading mechanism 154 and the unloading mechanism 157, a first grinding area 401 below the first grinding mechanism 10, a second grinding area 402 below the second grinding mechanism 20, and a third grinding area 403 below the third grinding mechanism 30.

The loading and unloading area 400 is an area or position where the loading mechanism 154 can load a wafer 5 onto a chuck table 50 and the unloading mechanism 157 can unload a wafer 5 from a chuck table 50 when the chuck table 50 is positioned in the loading and unloading area 400. The loading mechanism 154 delivers a wafer 5 to the chuck table 50 positioned in the loading and unloading area 400.

The first grinding area 401, the second grinding area 402, and the third grinding area 403 are areas where the first grinding mechanism 10, the second grinding mechanism 20, and the third grinding mechanism 30, respectively, can grind wafers 5 held on the respective chuck tables 50 that are positioned in the first, second, and third grinding areas 401, 402, and 403.

The first grinding area 401 is disposed on one side of the second apparatus base 202 in the +Y direction. The first grinding mechanism 10 and a first grinding feed mechanism 70 for grinding-feeding the first grinding mechanism 10 in a grinding feed direction are disposed in the first grinding area 401. The grinding feed direction is perpendicular to the holding surface 52 of each of the chuck tables 50.

The first grinding mechanism 10 grinds a wafer 5 with an annular array of first grindstones 11. Specifically, the first grinding mechanism 10 grinds a wafer 5 by bringing the lower surfaces of the first grindstones 11 into abrasive contact with a radial area of the wafer 5 held on the conical holding surface 52.

A thickness sensor 240 for measuring the thickness of a wafer 5 that is being ground by the first grinding mechanism 10 is disposed near the first grinding mechanism 10.

The second grinding area 402 and the third grinding area 403 are disposed on one side of the second apparatus base 202 in the −Y direction. The second grinding mechanism 20 and a second grinding feed mechanism 80 for grinding-feeding the second grinding mechanism 20 in a grinding feed direction are disposed in the second grinding area 402. The third grinding mechanism 30 and a third grinding feed mechanism 90 for grinding-feeding the third grinding mechanism 30 in a grinding feed direction are disposed in the third grinding area 403.

The second grinding mechanism 20 grinds a wafer 5 with an annular array of second grindstones 21. The third grinding mechanism 30 grinds a wafer 5 with an annular array of third grindstones 31.

Specifically, the second grinding mechanism 20 grinds a wafer 5 by bringing the lower surfaces of the second grindstones 21 into abrasive contact with a radial area of the wafer 5 held on the conical holding surface 52. The third grinding mechanism 30 grinds a wafer 5 by bringing the lower surfaces of the third grindstones 31 into abrasive contact with a radial area of the wafer 5 held on the conical holding surface 52.

Thickness sensors 240 for measuring the thickness of wafers 5 that are being ground by the second grinding mechanism 20 and the third grinding mechanism 30 are disposed near the second grinding mechanism 20 and the third grinding mechanism 30, respectively.

According to the present embodiment, the grinding apparatus 1 also includes, in the loading and unloading area 400, a two-fluid cleaning device, not illustrated, for cleaning the holding surface 52 with a two-fluid cleaning liquid that includes a mixture of water and air and a holding surface cleaning device, not illustrated, for cleaning the holding surface 52 with grindstones.

According to the present embodiment, the turntable 60 is rotated about its central axis to position a chuck table 50 successively beneath the first grindstones 11, the second grindstones 21, and the third grindstones 31, which grind a wafer 5 held on the holding surface 52 by way of in-feed grinding.

According to the present embodiment, for example, the first grindstones 11 include grindstones including relatively large abrasive grains for rough grinding, the second grindstones 21 include grindstones including middle-size abrasive grains, and the third grindstones 31 include grindstones including relatively small abrasive grains for finish grinding.

A wafer 5 that has been ground is unloaded from the chuck table 50 in the loading and unloading area 400 by the unloading mechanism 157, and delivered to a spin cleaning unit 265 that is disposed on the first apparatus base 201 in the vicinity of the turntable 60.

The spin cleaning unit 265 supplies pure water to the wafer 5 and rotates the wafer 5 about its central axis, thereby cleaning the wafer 5. Thereafter, the spin cleaning unit 265 rotates the wafer 5 at a speed higher than when it has cleaned the wafer 5, thereby drying the wafer 5.

According to an alternative cleaning process, the spin cleaning unit 265 may supply a chemical solution to the wafer 5 to clean the wafer 5, and then may remove the chemical solution with pure water supplied to the wafer 5.

The wafer 5 thus spin-cleaned by the spin cleaning unit 265 is put into the second cassette 151 by the robot 153.

The turntable 60, the chuck tables 50, the first through third grinding mechanisms 10, 20, and 30, the first through third grinding feed mechanisms 70, 80, and 90, and other components associated therewith will be described in greater detail below.

The turntable 60 is mounted on a table base 300 with support pads 310 (see FIG. 3) interposed therebetween. As illustrated in FIG. 1, the table base 300 is a base for the turntable 60 and is disposed substantially centrally on the second apparatus base 202 of the grinding apparatus 1. A cylindrical support post 320 erected from the table base 300 is fixed to the table base 300 at its center.

The turntable 60 is shaped as an annular plate with an opening defined centrally therein, and the support post 320 fixed to the table base 300 extends vertically through the central opening in the turntable 60. The turntable 60 is rotatable circumferentially around the support post 320.

The chuck tables 50 are disposed on the turntable 60. The turntable 60 is rotatably disposed centrally in a water case 61. The water case 61 has a rectangular bottom surface 65 and a plurality of outer walls 63 erected on the sides of the bottom surface 65. The bottom surface 65 has an opening, not illustrated, defined centrally therein where the turntable 60 is rotatable. The water case 61 also has a disk-shaped cover 62 disposed over the turntable 60 in covering relation to the opening defined in the bottom surface 65. The water case 61 further includes four inner walls 64 disposed on the upper surface of the cover 62 and dividing the upper surface of the cover 62 into four regions. The four chuck tables 50 are disposed respectively in the regions defined by the inner walls 64. The support post 320 that extends through the turntable 60 and the cover 62 is disposed centrally in the water case 61. In FIGS. 2 through 5, the water case 61 is omitted from illustration and the chuck tables 50 are illustrated as being mounted directly on the turntables 60 for a better understanding of other structural details.

Structural details of the first grinding mechanism 10, the second grinding mechanism 20, the third grinding mechanism 30, the first grinding feed mechanism 70, the second grinding feed mechanism 80, and the third grinding feed mechanism 90 will be described below.

Figure 2:
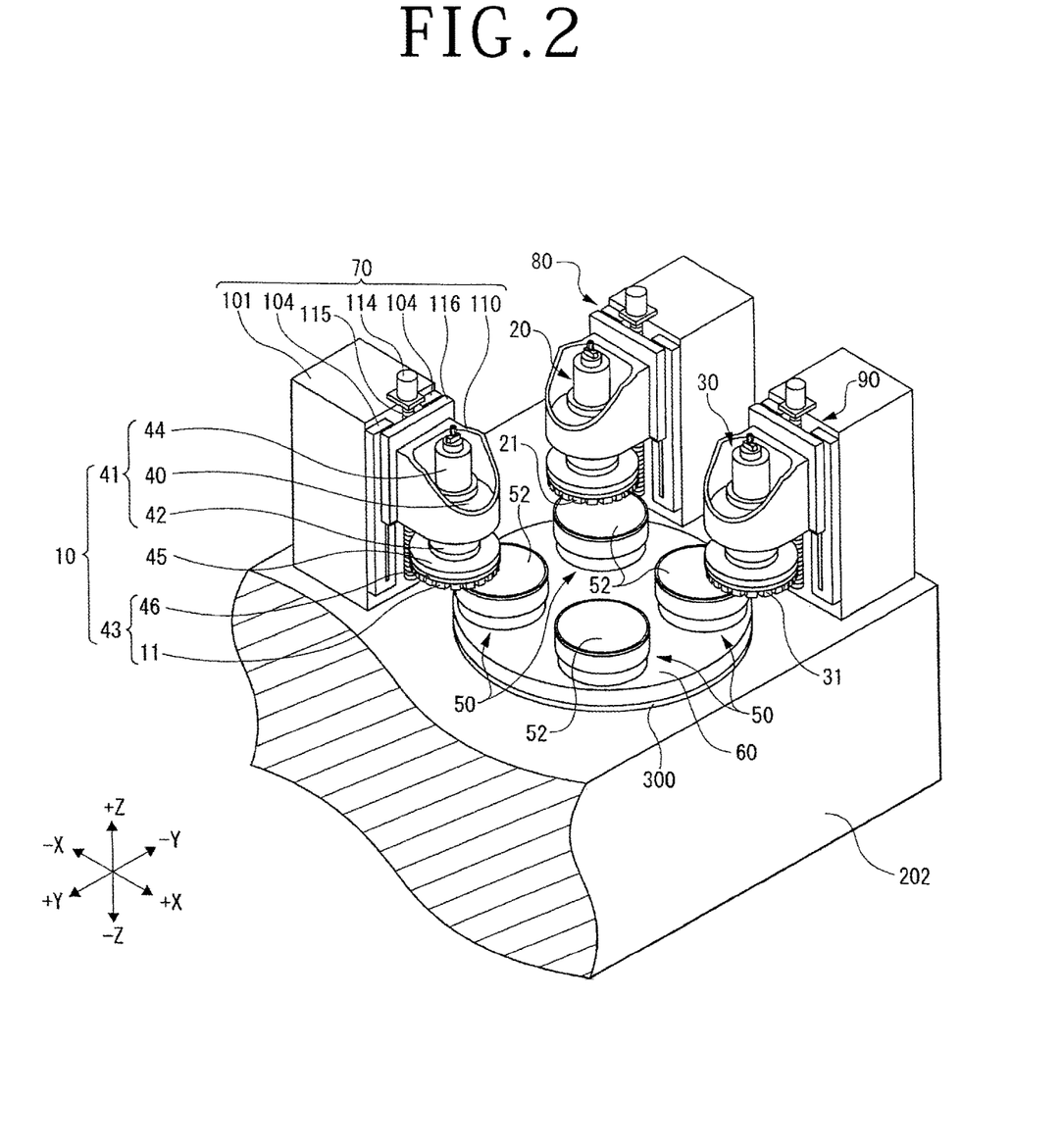
FIG. 2 is a perspective view of a turntable, chuck tables, grinding mechanisms, and grinding feed mechanisms of the grinding apparatus.

FIG. 2 illustrates in perspective some components on the second apparatus base 202. As illustrated in FIG. 2, the first grinding mechanism 10 and the first grinding feed mechanism 70 for grinding-feeding the first grinding mechanism 10 are disposed on a front area of the second apparatus base 202, i.e., on a side thereof in the +Y direction.

As illustrated in FIG. 2, the second grinding mechanism 20 and the second grinding feed mechanism 80 for grinding-feeding the second grinding mechanism 20, and the third grinding mechanism 30 and the third grinding feed mechanism 90 for grinding-feeding the third grinding mechanism 30 are disposed on a rear area of the second apparatus base 202, i.e., on a side thereof in the −Y direction.

In FIG. 2, only the second apparatus base 202, the table base 300, the turntable 60, the chuck tables 50, the first through third grinding mechanisms 10, 20, and 30, and the first through third grinding feed mechanisms 70, 80, and 90 are illustrated with other components omitted from illustration.

Each of the first through third grinding mechanisms 10, 20, and 30 includes a spindle unit 41. The first through third grinding feed mechanisms 70, 80, and 90 are arranged to grinding-feed the respective first through third grinding mechanisms 10, 20, and 30 including the respective spindle units 41 in the grinding feed direction.

The first through third grinding mechanisms 10, 20, and 30 are identical in structure to each other except that they include the first grindstones 11, the second grindstones 21, and the third grindstones 31, respectively. Therefore, those structural details of the first grinding mechanism 10 that are identical to those of the second and third grinding mechanisms 20 and 30 will be described below.

Similarly, the first through third grinding feed mechanisms 70, 80, and 90 are identical in structure to each other. Therefore, those structural details of the first grinding feed mechanism 70 that are identical to those of the second and third grinding feed mechanisms 80 and 90 will be described below.

The first grinding feed mechanism 70 includes a column 101 having a prismatic shape that is disposed on the second apparatus base 202 outside of the turntable 60.

The first grinding feed mechanism 70 also includes a pair of guide rails 104 disposed on one face of the column 101 and extending vertically along the Z-axis, a lifting and lowering table 116 slidable on the guide rails 104, a ball screw 115 disposed between and extending parallel to the guide rails 104, a Z-axis motor 114 for rotating the ball screw 115 about its central axis, and a holder 110 mounted on a front surface, i.e., a face side, of the lifting and lowering table 116. The holder 110 holds the first grinding mechanism 10 thereon.

The guide rails 104 guide the first grinding mechanism 10 to move in the grinding feed direction. The lifting and lowering table 116 is slidably mounted on the guide rails 104. A nut, not illustrated, is fixed to a rear surface, a reverse side, of the lifting and lowering table 116. The ball screw 115 is operatively threaded through the nut. The Z-axis motor 114 is coupled to an end of the ball screw 115.

When the Z-axis motor 114 is energized, it rotates the ball screw 115 about its central axis, causing the nut to move the lifting and lowering table 116 in the +Z or −Z direction along the guide rails 104. The holder 110 mounted on the lifting and lowering table 116 and the first grinding mechanism 10 held on the holder 110 are also moved together with the lifting and lowering table 116 in the +Z or −Z direction. In this manner, the first grinding feed mechanism 70 can grind-feed the first grinding mechanism 10 in the grinding feed direction along the Z-axis. In FIG. 2, the grinding feed direction is represented by the −Z direction. The ball screw 115 functions as an advancing and retracting shaft for moving the first grinding mechanism 10 along the Z-axis.

The first grinding mechanism 10 includes a spindle housing 40 fixedly mounted on the holder 110, a spindle 42 rotatably held in the spindle housing 40, a spindle motor 44 for rotating the spindle 42 about its central axis, a wheel mount 45 mounted on the lower end of the spindle 42, and a grinding wheel 43 detachably connected to the lower surface of the wheel mount 45.

The spindle housing 40, the spindle 42, and the spindle motor 44 jointly make up a spindle unit 41 of the first grinding mechanism 10.

The spindle housing 40 is held on the holder 110 such that the spindle housing 40 extends along the Z-axis. The spindle 42 extends along the Z-axis substantially perpendicularly to the holding surface 52 of the chuck table 50 that is positioned below the first grinding mechanism 10. The spindle 42 is rotatably supported by the spindle housing 40.

The spindle motor 44 is coupled to the upper end of the spindle 42. When energized, the spindle motor 44 rotates the spindle 42 about its central axis passing through the center of the annular array of the first grindstones 11 and extending along the Z-axis.

The spindle 42 extends through an opening defined in a bottom plate of the holder 110, and the wheel mount 45 is disposed beneath the opening in the bottom plate of the holder 110. The wheel mount 45 is shaped as a circular plate and fixed to the lower end, i.e., the distal end, of the spindle 42. The wheel mount 45 rotates in unison with the spindle 42. The wheel mount 45 supports the grinding wheel 43 on its lower surface.

The grinding wheel 43 is substantially equal in diameter to the wheel mount 45. The grinding wheel 43 includes an annular wheel base, i.e., an annular base, 46 made of a metal material such as an aluminum alloy. The first grindstones 11, each substantially shaped as a rectangular parallelepiped, are arranged in an annular array and fixed to a lower surface of the wheel base 46.

In operation, the first grinding mechanism 10 is grinding-fed in the grinding feed direction, i.e., the −Z direction, by the first grinding feed mechanism 70 to bring the first grindstones 11 into abrasive contact with a wafer 5 held on the chuck table 50 positioned beneath the first grinding mechanism 10. When the spindle 42 is rotated about its central axis by the spindle motor 44, the first grindstones 11 of the grinding wheel 43 on the distal end of the spindle 42 are rotated about the central axis of the spindle 42, grinding the wafer 5 held on the chuck table 50.

The first grinding feed mechanism 70 may include a counterbalance, not illustrated. The counterbalance is mounted on the column 101 and the holder 110 so as to bridge them from above. The counterbalance is arranged to lift the holder 110 with a force depending on the weight of the holder 110 and the first grinding mechanism 10 held thereby. The counterbalance acts to reduce the load imposed on the first grinding feed mechanism 70 by the weight of holder 110 and the first grinding mechanism 10 held thereby. The force produced by the counterbalance to lift the holder 110 is slightly larger than the weight of holder 110 and the first grinding mechanism 10 held thereby.

Figure 3:
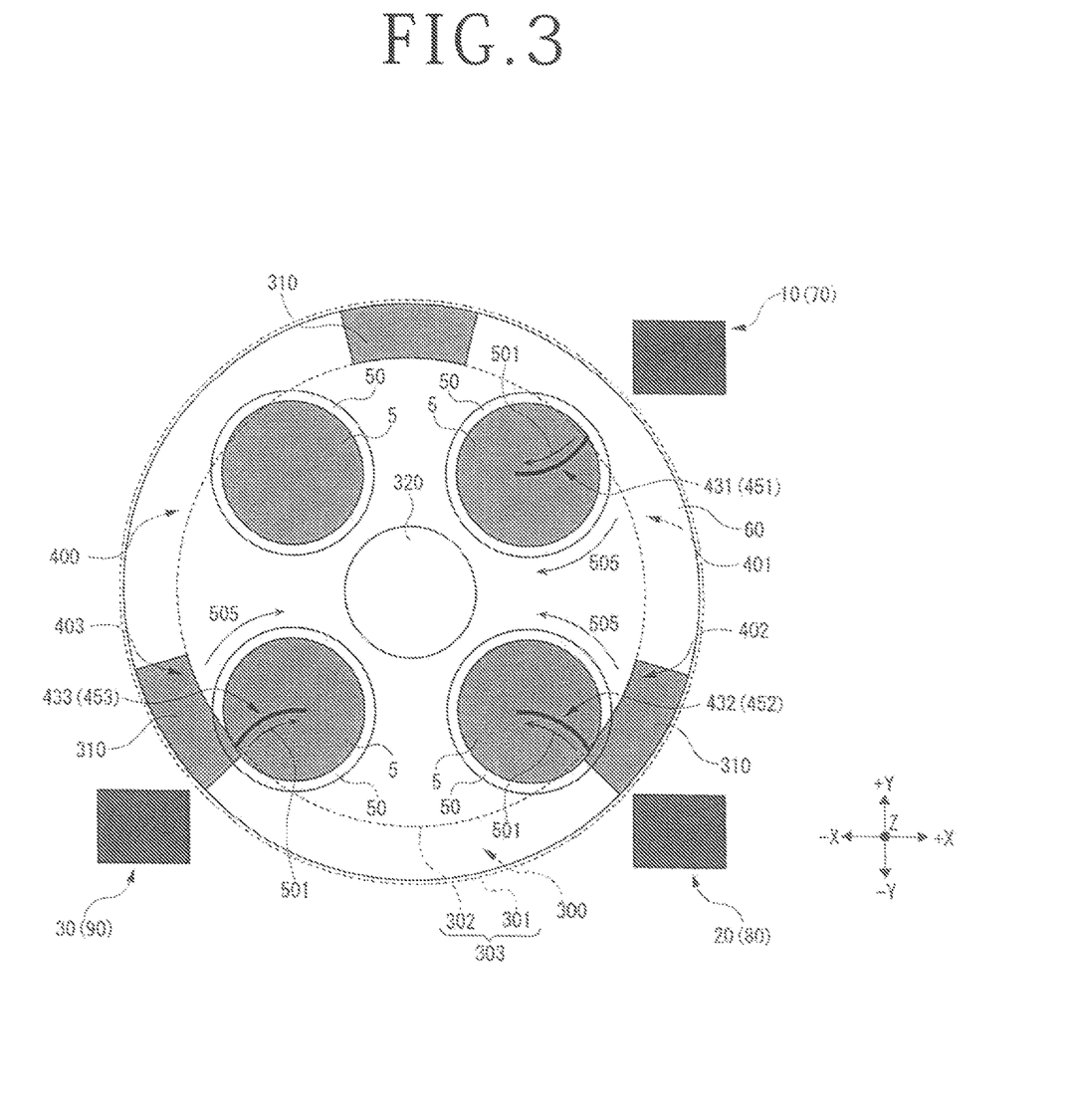
FIG. 3 is a plan view illustrating grinding areas formed by grinding stones of the grinding mechanisms.

The table base 300 for the turntable 60 and the support pads 310 will be described below. As illustrated in FIG. 3, the table base 300 has a side wall 303 shaped as a hollow cylinder and having a circular outer side surface 301 that is substantially equal in diameter to the outside diameter of the turntable 60 and a circular inner side surface 302 that is smaller in diameter than the circular outer side surface 301. The support pads 310 are disposed on the upper surface of the table base 300, i.e., the upper surface of the side wall 303. The support post 320 is fixed to and erected from a bottom surface, not illustrated, of the table base 300.

As illustrated in FIG. 3, the support pads 310 are disposed on the table base 300 in contact with a lower surface of the turntable 60 at respective positions that correspond to the vertexes of an essentially equilateral triangle as viewed in plan.

The support pads 310 have respective air ejection ports that are connected to an air source, not illustrated. When the turntable 60 is rotated about its own center, the air ejection ports of the support pads 310 eject air supplied from the air source upwardly to the lower surface of the turntable 60, levitating the turntable 60 from the table base 300. In this manner, the support pads 310 support the turntable 60 out of contact therewith while the turntable 60 is being rotated.

According to the present embodiment, consequently, when the control unit 7 controls the turntable motor to rotate the turntable 60 about its central axis, the control unit 7 also controls the air source to eject air from the support pads 310 to levitate the turntable 60 from the table base 300. The control unit 7 controls the turntable motor to rotate the turntable 60 about its central axis to bring the chuck tables 50 that are holding respective wafers 5 thereon to respective positions below the first grindstones 11 of the first grinding mechanism 10 in the first grinding area 401, the second grindstones 21 of the second grinding mechanism 20 in the second grinding area 402, and the third grindstones 31 of the third grinding mechanism 30 in the third grinding area 403.

After the chuck tables 50 have been placed in the respective positions, the control unit 7 controls the air source to stop ejecting air from the air ejection ports of the support pads 310, allowing the turntable 60 to drop onto the support pads 310 to place its lower surface in contact with the support pads 310.

FIG. 3 illustrates a first grinding region 431, a second grinding region 432, and a third grinding region 433 where the lower surfaces of the first grindstones 11, the second grindstones 21, and the third grindstones 31 are held in contact with the upper surfaces of the wafers 5 held on the respective chuck tables 50.

The first through third grinding regions 431 through 433 are developed radially inwardly on the upper surfaces of the respective wafers 5 when the chuck tables 50 are rotated about their central axes in the directions indicated by the arrows 505 and the first grindstones 11, the second grindstones 21, and the third grindstones 31 are rotated about their central axes in the directions indicated by the arrows 501. Each of the first through third grinding regions 431 through 433 is of a relatively narrow arcuate shape.

A grinding process performed by the grinding apparatus 1 under the control of the control unit 7 will be described hereinbelow.

[Holding Step]

First, the control unit 7 controls the robot 153 and the loading mechanism 154 illustrated in FIG. 1 to take out a wafer 5 to be processed from the first cassette 150, place the wafer 5 on the temporary rest table 156, and then place the wafer 5 on the holding surface 52 of the chuck table 50 positioned in the loading and unloading area 400, so that the wafer 5 is held on the holding surface 52 of the chuck table 50.

[First Grinding Step]

Then, the control unit 7 controls the position of the chuck table 50 that is holding the wafer 5 with respect to the first grinding mechanism 10.

Specifically, the control unit 7 rotates the turntable 60 to place the chuck table 50 that is holding the wafer 5 below the first grinding mechanism 10 in the first grinding area 401.

In the first grinding area 401, the holder 110 of the first grinding feed mechanism 70 holds the spindle unit 41 of the first grinding mechanism 10 (see FIG. 2).

The lower surfaces of the first grindstones 11 on the distal end of the spindle unit 41 lie parallel to a radial area of the conical holding surface 52 of the chuck table 50. Specifically, the spindle unit 41 of the first grinding mechanism 10 has been adjusted to tilt such that one of two radial areas of the holding surface 52 that are diametrically opposite each other across the center of the holding surface 52 and that underlie the first grindstones 11 lies parallel to the lower surfaces of the first grindstones 11. When the first grindstones 11 contact the wafer 5 held on the radial area of the holding surface 52, the first grindstones 11 develop the arcuate first grinding region 431 that extends radially inwardly on the wafer 5, as illustrated in FIG. 3.

Then, the control unit 7 controls the first grinding mechanism 10 and the first grinding feed mechanism 70 to grind the wafer 5 held on the chuck table 50. Now, a first ground mark 451 shaped similarly to the first grinding region 431 is formed on the wafer 5. Actually, first ground marks 451 are formed entirely on the ground surface of the wafer 5. In FIG. 3, however, only the first ground mark 451 that overlaps the first grinding region 431 is illustrated for the sake of brevity. This also holds true for a second ground mark 452 and a third ground mark 453 to be described later.

[Second Grinding Step]

After the first grinding step is completed, the control unit 7 controls the position of the chuck table 50 that is holding the wafer 5 with respect to the second grinding mechanism 20.

Specifically, the control unit 7 rotates the turntable 60 to place the chuck table 50 that is holding the wafer 5 below the second grinding mechanism 20 in the second grinding area 402.

In the second grinding area 402, the holder 110 of the second grinding feed mechanism 80 holds the spindle unit 41 of the second grinding mechanism 20 (see FIG. 2).

The lower surfaces of the second grindstones 21 on the distal end of the spindle unit 41 lie parallel to a radial area of the conical holding surface 52 of the chuck table 50. Specifically, the spindle unit 41 of the second grinding mechanism 20 has been adjusted to tilt such that the other of the two radial areas of the holding surface 52 that are diametrically opposite each other across the center of the holding surface 52 and that underlie the second grindstones 21, the other radial area not lying parallel to the lower surfaces of the first grindstones 11, lies parallel to the lower surfaces of the second grindstones 21. When the second grindstones 21 contact the wafer 5 held on the radial area of the holding surface 52, the second grindstones 21 develop the arcuate second grinding region 432 that extends radially inwardly on the wafer 5, as illustrated in FIG. 3. Stated otherwise, the second grinding mechanism 20 is positioned with respect to the chuck table 50 such that the second grinding region 432 extends across the first grinding region 431.

Then, the control unit 7 controls the second grinding mechanism 20 and the second grinding feed mechanism 80 to grind the wafer 5 held on the chuck table 50. Now, a second ground mark 452 shaped similarly to the second grinding region 432 is formed on the wafer 5.

In the first grinding step and the second grinding step, as described above, the first grinding mechanism 10 and the second grinding mechanism 20 are positioned with respect to the chuck table 50 such that the second ground mark 452 produced on the wafer 5 by the second grindstones 21 as they grind the wafer 5 extends across the first ground mark 451 produced on the wafer 5 by the first grindstones 11 as they grind the wafer 5.

[Third Grinding Step]

After the second grinding step is completed, the control unit 7 controls the position of the chuck table 50 that is holding the wafer 5 with respect to the third grinding mechanism 30.

Specifically, the control unit 7 rotates the turntable 60 to place the chuck table 50 that is holding the wafer 5 below the third grinding mechanism 30 in the third grinding area 403.

In the third grinding area 403, the holder 110 of the third grinding feed mechanism 90 holds the spindle unit 41 of the third grinding mechanism 30 (see FIG. 2).

The lower surfaces of the third grindstones 31 on the distal end of the spindle unit 41 lie parallel to a radial area of the conical holding surface 52 of the chuck table 50. Specifically, the spindle unit 41 of the third grinding mechanism 30 has been adjusted to tilt such that the one of the two radial areas of the holding surface 52 that are diametrically opposite each other across the center of the holding surface 52 and that underlie the third grindstones 31, the one radial area not lying parallel to the lower surfaces of the second grindstones 21, lies parallel to the lower surfaces of the third grindstones 31. When the third grindstones 31 contact the wafer 5 held on the radial area of the holding surface 52, the third grindstones 31 develop the arcuate third grinding region 433 that extends radially inwardly on the wafer 5, as illustrated in FIG. 3. Stated otherwise, the third grinding mechanism 30 is positioned with respect to the chuck table 50 such that the third grinding region 433 extends across the second grinding region 432.

Then, the control unit 7 controls the third grinding mechanism 30 and the third grinding feed mechanism 90 to grind the wafer 5 held on the chuck table 50. Now, a third ground mark 453 shaped similarly to the third grinding region 433 is formed on the wafer 5.

In the second grinding step and the third grinding step, as described above, the second grinding mechanism 20 and the third grinding mechanism 30 are positioned with respect to the chuck table 50 such that the third ground mark 453 produced on the wafer 5 by the third grindstones 31 as they grind the wafer 5 extends across the second ground mark 452 produced on the wafer 5 by the second grindstones 21 as they grind the wafer 5.

[Cleaning and Retrieving Step]

After the third grinding step is completed, the control unit 7 rotates the turntable 60 to place the chuck table 50 that is holding the wafer 5 in the loading and unloading area 400. The control unit 7 controls the unloading mechanism 157 illustrated in FIG. 1 to deliver the wafer 5 to the spin cleaning unit 265 where the wafer 5 is spin-cleaned. Thereafter, the control unit 7 controls the robot 153 to put the spin-cleaned wafer 5 into the second cassette 151.

According to the present embodiment, as described above, in the second grinding step, the second grinding mechanism 20 is positioned with respect to the chuck table 50 such that the second ground mark 452 produced on the wafer 5 by the second grindstones 21 extends across the first ground mark 451 produced on the wafer 5 by the first grindstones 11. Furthermore, in the third grinding step, the third grinding mechanism 30 is positioned with respect to the chuck table 50 such that the third ground mark 453 produced on the wafer 5 by the third grindstones 31 extends across the second ground mark 452 produced on the wafer 5 by the second grindstones 21.

Therefore, the wafer 5 is ground so as to scrape off the first ground mark 451 in the second grinding step, and the wafer 5 is ground so as to scrape off the second ground mark 452 in the third grinding step. Consequently, the wafer 5 that is thus ground is of high quality as it has small thickness variations and high flexural strength.

Moreover, when appropriate impact forces act on the second grindstones 21 that form the second ground mark 452 extending across the first ground marks 451 and the third grindstones 31 that form the third ground mark 453 extending across the second ground mark 452 when the second grindstones 21 and the third grindstones 31 grind the wafer 5 to form those intersecting ground marks, the second grindstones 21 and the third grindstones 31 are dressed on their own, i.e., self-dressed. Accordingly, the grinding capability of the second grindstones 21 and the third grindstones 31 is maintained and increased.

The first grinding feed mechanism 70, the second grinding feed mechanism 80, and the third grinding feed mechanism 90 according to the present embodiment support the respective spindle units 41 of the first grinding mechanism 10, the second grinding mechanism 20, and the third grinding mechanism 30.

According to the present embodiment, the grinding apparatus 1 has two cassettes, i.e., the first cassette 150 and the second cassette 151, for housing wafers 5. According to the present invention, however, the grinding apparatus may not necessarily have two cassettes, but may have one cassette or three or more cassettes for housing wafers.

The grinding apparatus according to the present invention may include at least four chuck tables 50 for holding wafers 5 on their holding surfaces 52 on the turntable 60, and may include at least three grinding mechanisms.

The grinding apparatus may include five chuck tables 50 on the turntable 60 and may include four grinding mechanisms. In an example illustrated in FIG. 4, the first grinding mechanism 10, the second grinding mechanism 20, and the third grinding mechanism 30 are provided in combination with the first grinding feed mechanism 70, the second grinding feed mechanism 80, and the third grinding feed mechanism 90, respectively, and a fourth grinding mechanism 35 are provided in combination with a fourth grinding feed mechanism 95 for grinding-feeding the fourth grinding mechanism 35.

Figure 4:
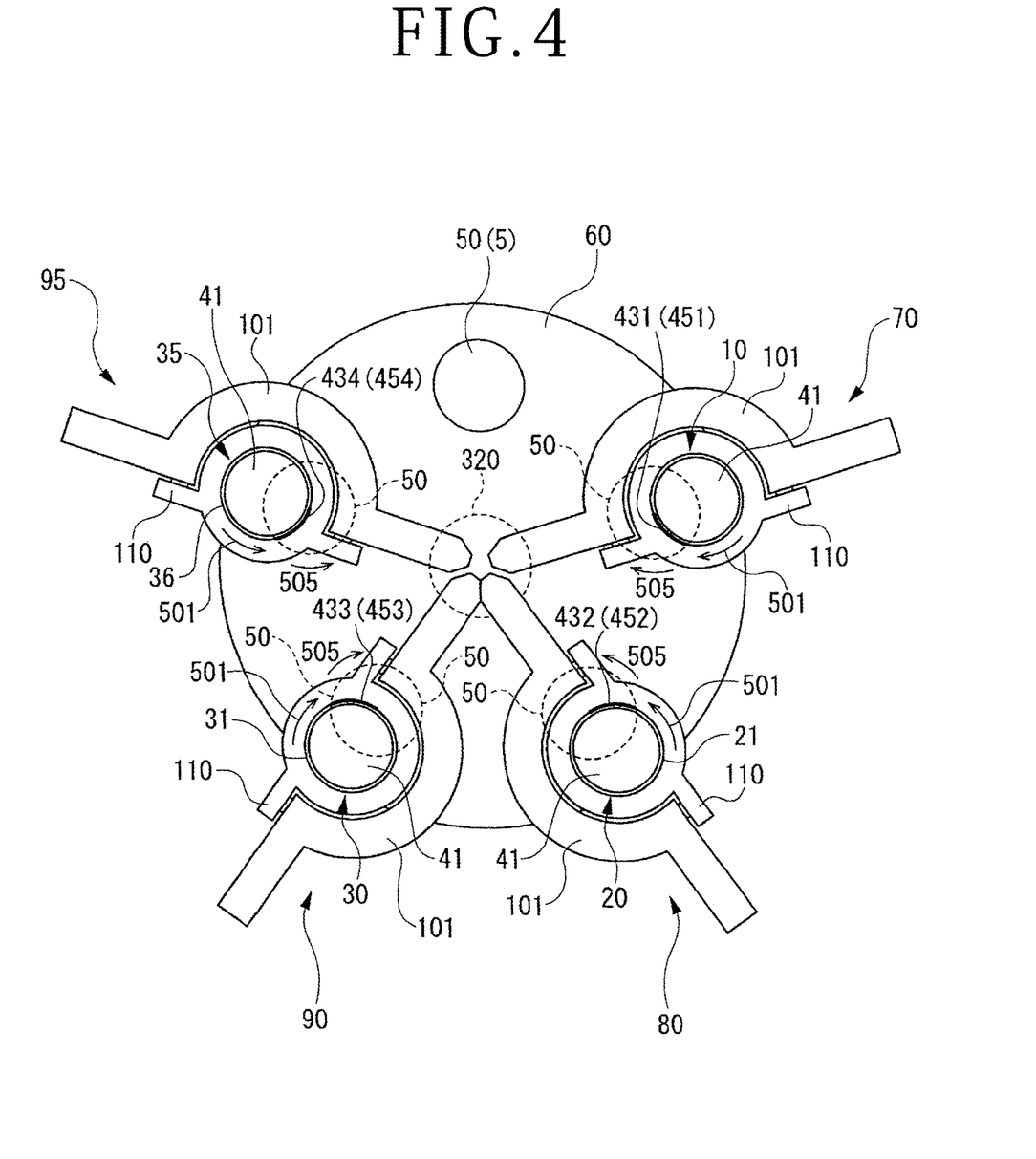
FIG. 4 is a plan view illustrating structural details of a grinding apparatus having five chuck tables on a turntable and four grinding mechanisms.

Five chuck tables 50 are disposed in circumferentially spaced positions at equal angular intervals on the upper surface of the turntable 60. The first grinding mechanism 10, the second grinding mechanism 20, the third grinding mechanism 30, and the fourth grinding mechanisms 35 are disposed respectively above four of the five chuck tables 50.

The fourth grinding mechanism 35 is structurally identical to the third grinding mechanism 30, etc., and has fourth grindstones 36. The fourth grindstones 36 include grindstones for final finish grinding that include abrasive grains smaller than those of the third grindstones 31, for example.

When the fourth grindstones 36 are rotated, they develop a fourth grinding region 434 on the upper surface of the wafer 5 held on the chuck table 50. The fourth grinding region 434 is of a relatively narrow arcuate shape as is the case with the first through third grinding regions 431 through 433.

In FIG. 4, the first through fourth grindstones 11, 21, 31, and 36 are rotated in the directions indicated by the arrow 501, whereas the chuck tables 50 are rotated in the directions indicated by the arrows 505.

In the example illustrated in FIG. 4, each of the first grinding feed mechanism 70, the second grinding feed mechanism 80, the third grinding feed mechanism 90, and the fourth grinding feed mechanism 95 includes the column 101, the holder 110, and so on. The column 101 may include a portal-shaped column including posts with the holder 110 interposed therebetween. The posts of the portal-shaped column are positioned such that the chuck table 50 is interposed between the posts.

For grinding the wafer 5 on the chuck table 50 with the fourth grinding mechanism 35, the chuck table 50 is positioned with respect to the fourth grinding mechanism 35 and the turntable 60 is rotated such that a fourth ground mark 454 produced on the wafer 5 by the fourth grindstones 36 extends across the third ground mark 453 produced on the wafer 5 by the third grindstones 31. Therefore, the wafer 5 is ground so as to scrape off the third ground mark 453. Accordingly, the wafer 5 that is thus ground is of high quality as it has small thickness variations and high flexural strength. Furthermore, the grinding capability of the second grindstones 21, the third grindstones 31, and the fourth grindstones 36 is maintained and increased.

Figure 5:
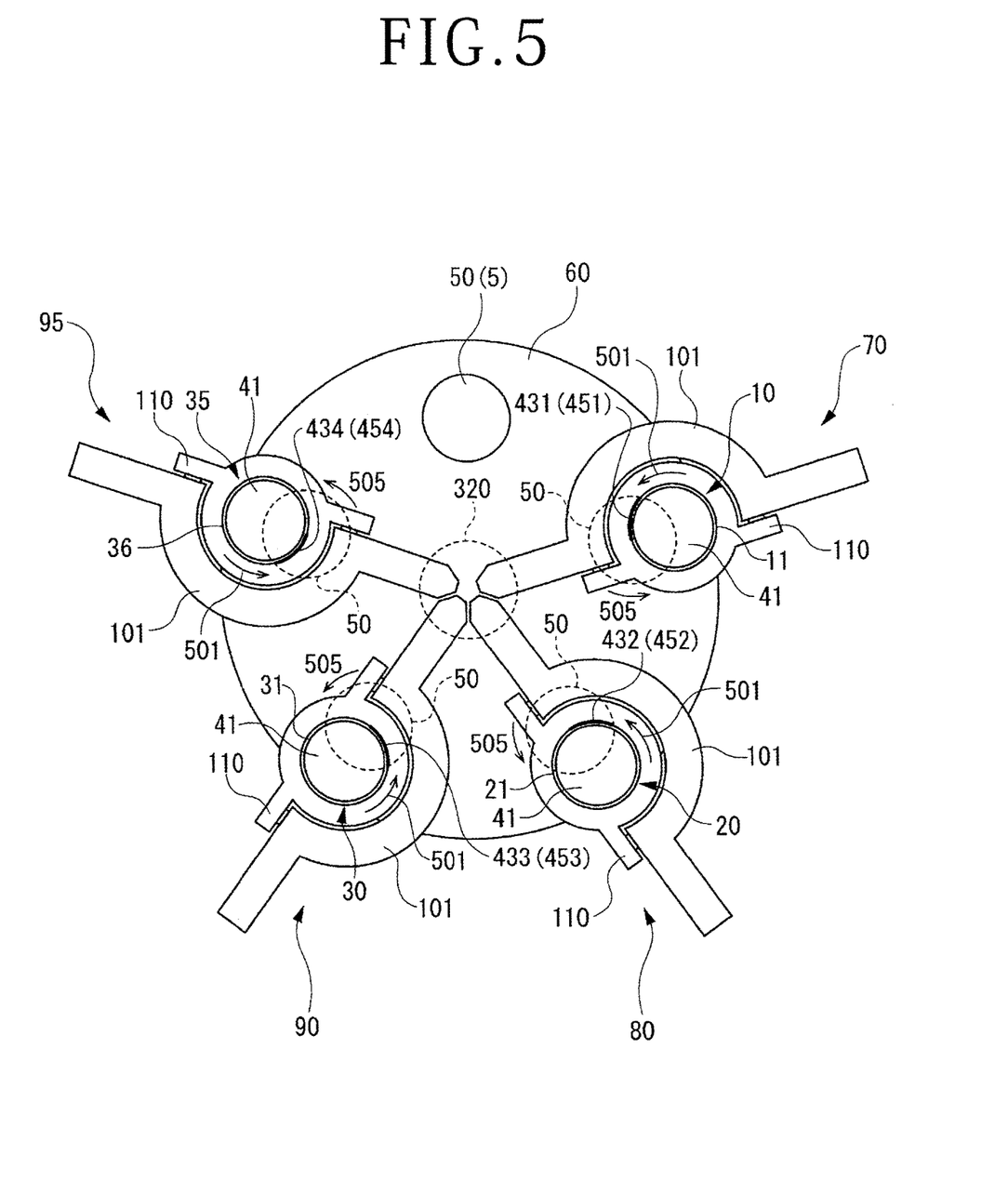
FIG. 5 is a plan view illustrating structural details of another grinding apparatus having five chuck tables on a turntable and four grinding mechanisms.

The second grinding feed mechanism 80 and the fourth grinding feed mechanism 95 in the grinding apparatus having the fourth grinding mechanisms illustrated in FIG. 4 may have their columns 101 and holders 110 oriented in different directions, as illustrated in FIG. 5. The grinding apparatus with the second grinding feed mechanism 80 and the fourth grinding feed mechanism 95 modified as illustrated in FIG. 5 offers the same advantages as those of the grinding apparatus illustrated in FIG. 4.

The present invention is not limited to the details of the above described preferred embodiment. The scope of the invention is defined by the appended claim and all changes and modifications as fall within the equivalence of the scope of the claim are therefore to be embraced by the invention.

What is claimed is:

1. A grinding apparatus for grinding a wafer, comprising:
at least four chuck tables for holding respective wafers on holding surfaces thereof;
a first grinding mechanism for grinding the wafer held on the holding surface of one of the chuck tables by keeping lower surfaces of first grindstones arranged in an annular array on a first grinding wheel in contact with a radial area of the wafer;
a second grinding mechanism for grinding the wafer held on the holding surface of one of the chuck tables by keeping lower surfaces of second grindstones arranged in an annular array on a second grinding wheel in contact with a radial area of the wafer;
a third grinding mechanism for grinding the wafer held on the holding surface of one of the chuck tables by keeping lower surfaces of third grindstones arranged in an annular array on a third grinding wheel in contact with a radial area of the wafer;
a first grinding feed mechanism for grinding-feeding the first grinding mechanism in a grinding feed direction perpendicular to the holding surface of one of the chuck tables;
a second grinding feed mechanism for grinding-feeding the second grinding mechanism in a grinding feed direction perpendicular to the holding surface of one of the chuck tables;
a third grinding feed mechanism for grinding-feeding the third grinding mechanism in a grinding feed direction perpendicular to the holding surface of one of the chuck tables;
a turntable with the chuck tables mounted thereon, the turntable being rotatable about a central axis of the turntable for positioning the chuck tables respectively with respect to the first grindstones, the second grindstones, and the third grindstones; and
a control unit,
wherein:
the first grinding mechanism and the second grinding mechanism are positioned with respect to the chuck tables such that a second ground mark produced on the wafer by the second grindstones when the wafer is ground by the second grindstones extends across a first ground mark produced on the wafer by the first grindstones when the wafer is ground by the first grindstones, wherein the first ground mark is developed radially inwardly on the wafer by the control unit by rotating the first grinding wheel in a clockwise direction while simultaneously rotating an associated one of the chuck tables in the clockwise direction and wherein the second ground mark is developed radially inwardly on the wafer by the control unit by rotating the second grinding wheel in a counter-clockwise direction while simultaneously rotating an associated one of the chuck tables in the counter-clockwise direction, and
the second grinding mechanism and the third grinding mechanism are positioned with respect to the chuck tables such that a third ground mark produced on the wafer by the third grindstones when the wafer is ground by the third grindstones extends across the second ground mark produced on the wafer by the second grindstones, wherein the third ground mark is developed radially inwardly on the wafer by the control unit by rotating the third grinding wheel in a clockwise direction while simultaneously rotating an associated one of the chuck tables in the clockwise direction.

2. The grinding apparatus according to claim 1, wherein the holding surface of each of the chuck tables includes a center, and further wherein the holding surface of each of the chuck tables includes an upwardly convex conical surface having a vertex at the holding surface's center.

3. The grinding apparatus according to claim 2, wherein: a first spindle unit of the first grinding wheel has been adjusted to tilt such that one of two radial areas of the holding surface that are diametrically opposite each other across the center of the holding surface and that underlie the first grindstones lies parallel to the lower surfaces of the first grindstones; a second spindle unit of the second grinding wheel has been adjusted to tilt such that the other of the two radial areas of the holding surface that are diametrically opposite each other across the center of the holding surface and that underlie the second grindstones lies parallel to the lower surfaces of the second grindstones; and a third spindle unit of the third grinding wheel has been adjusted to tilt such that the one of two radial areas of the holding surface that are diametrically opposite each other across the center of the holding surface and that underlie the third grindstones lies parallel to the lower surfaces of the third grindstones.

4. The grinding apparatus according to claim 1, wherein: the first grindstones are each shaped as a rectangular parallelepiped; the second grindstones are each shaped as a rectangular parallelepiped; and the third grindstones are each shaped as a rectangular parallelepiped.

5. The grinding apparatus according to claim 1, wherein: the first grindstones include large abrasive grains; the second grindstones include middle-sized abrasive grains; and the third grindstones include small abrasive grains.

6. The grinding apparatus according to claim 1, wherein: the first grindstones are each shaped as a rectangular parallelepiped, and the first grindstones include large abrasive grains; the second grindstones are each shaped as a rectangular parallelepiped, and the second grindstones include middle-sized abrasive grains; and the third grindstones are each shaped as a rectangular parallelepiped, and the third grindstones include small abrasive grains.

7. The grinding apparatus according to claim 1, further comprising: a fourth grinding mechanism for grinding the wafer held on the holding surface of one of the chuck tables by keeping lower surfaces of fourth grindstones arranged in an annular array on a fourth grinding wheel in contact with a radial area of the wafer; a fourth grinding feed mechanism for grinding-feeding the fourth grinding mechanism in a grinding feed direction perpendicular to the holding surface of one of the chuck tables; and a fifth chuck table mounted on the turntable such that the at least four chuck tables comprises five chuck tables; wherein the first grinding feed mechanism includes a first column and a first holder configured and arranged for holding the first grinding mechanism, wherein the first holder is movable in the grinding feed direction with respect to the first column, and further wherein the first column includes a first curved portion between a pair of first posts, where the first holder is positioned within a first opening defined by the first curved portion; wherein the second grinding feed mechanism includes a second column and a second holder configured and arranged for holding the second grinding mechanism, wherein the second holder is movable in the grinding feed direction with respect to the second column, and further wherein the second column includes a second curved portion between a pair of second posts, where the second holder is positioned within a second opening defined by the second curved portion; wherein the third grinding feed mechanism includes a third column and a third holder configured and arranged for holding the third grinding mechanism, wherein 11 the third holder is movable in the grinding feed direction with respect to the third column, and further wherein the third column includes a third curved portion between a pair of third posts, where the third holder is positioned within a third opening defined by the third curved portion; wherein the fourth grinding feed mechanism includes a fourth column and a fourth holder configured and arranged for holding the fourth grinding mechanism, wherein the fourth holder is movable in the grinding feed direction with respect to the fourth column, and further wherein the fourth column includes a fourth curved portion between a pair of fourth posts, where the fourth holder is positioned within a fourth opening defined by the fourth curved portion; and wherein the first opening and the second opening face each other, and further wherein the third opening and the fourth opening face each other.

8. The grinding apparatus according to claim 1, further comprising: a fourth grinding mechanism for grinding the wafer held on the holding surface of one of the chuck tables by keeping lower surfaces of fourth grindstones arranged in an annular array on a fourth grinding wheel in contact with a radial area of the wafer; a fourth grinding feed mechanism for grinding-feeding the fourth grinding mechanism in a grinding feed direction perpendicular to the holding surface of one of the chuck tables; and a fifth chuck table mounted on the turntable such that the at least four chuck tables comprises five chuck tables; wherein the first grinding feed mechanism includes a first column and a first holder configured and arranged for holding the first grinding mechanism, wherein the first holder is movable in the grinding feed direction with respect to the first column, and further wherein the first column includes a first curved portion between a pair of first posts, where the first holder is positioned within a first opening defined by the first curved portion; wherein the second grinding feed mechanism includes a second column and a second holder configured and arranged for holding the second grinding mechanism, wherein the second holder is movable in the grinding feed direction with respect to the second column, and further wherein the second column includes a second curved portion between a pair of second posts, where the second holder is positioned within a second opening defined by the second curved portion; wherein the third grinding feed mechanism includes a third column and a third holder configured and arranged for holding the third grinding mechanism, wherein the third holder is movable in the grinding feed direction with respect to the third column, and further wherein the third column includes a third curved portion between a pair of third posts, where the third holder is positioned within a third opening defined by the third curved portion; wherein the fourth grinding feed mechanism includes a fourth column and a fourth holder configured and arranged for holding the fourth grinding mechanism, wherein the fourth holder is movable in the grinding feed direction with respect to the fourth column, and further wherein the fourth column includes a fourth curved portion between a pair of fourth posts, where the fourth holder is positioned within a fourth opening defined by the fourth curved portion; and wherein the first posts, the second posts, the third posts and the fourth posts all extend in radial directions towards the central axis of the turntable.

9. A grinding apparatus for grinding a wafer, comprising:
at least four chuck tables for holding respective wafers on holding surfaces thereof;
a first grinding mechanism for grinding the wafer held on the holding surface of one of the chuck tables by keeping lower surfaces of first grindstones arranged in an annular array on a first grinding wheel in contact with a radial area of the wafer;
a second grinding mechanism for grinding the wafer held on the holding surface of one of the chuck tables by keeping lower surfaces of second grindstones arranged in an annular array on a second grinding wheel in contact with a radial area of the wafer;
a third grinding mechanism for grinding the wafer held on the holding surface of one of the chuck tables by keeping lower surfaces of third grindstones arranged in an annular array on a third grinding wheel in contact with a radial area of the wafer;
a first grinding feed mechanism for grinding-feeding the first grinding mechanism in a grinding feed direction perpendicular to the holding surface of one of the chuck tables;
a second grinding feed mechanism for grinding-feeding the second grinding mechanism in a grinding feed direction perpendicular to the holding surface of one of the chuck tables;
a third grinding feed mechanism for grinding-feeding the third grinding mechanism in a grinding feed direction perpendicular to the holding surface of one of the chuck tables;
a turntable with the chuck tables mounted thereon, the turntable being rotatable about a central axis of the turntable for positioning the chuck tables respectively with respect to the first grindstones, the second grindstones, and the third grindstones; and
a control unit,
wherein:
the first grinding mechanism and the second grinding mechanism are positioned with respect to the chuck tables such that a second ground mark produced on the wafer by the second grindstones when the wafer is ground by the second grindstones extends across a first ground mark produced on the wafer by the first grindstones when the wafer is ground by the first grindstones, wherein the first ground mark is developed radially inwardly on the wafer by the control unit by rotating the first grinding wheel in a counter-clockwise direction while simultaneously rotating an associated one of the chuck tables in the counter-clockwise direction and wherein the second ground mark is developed radially inwardly on the wafer by the control unit by rotating the second grinding wheel in a clockwise direction while simultaneously rotating an associated one of the chuck tables in the clockwise direction, and
the second grinding mechanism and the third grinding mechanism are positioned with respect to the chuck tables such that a third ground mark produced on the wafer by the third grindstones when the wafer is ground by the third grindstones extends across the second ground mark produced on the wafer by the second grindstones, wherein the third ground mark is developed radially inwardly on the wafer by the control unit by rotating the third grinding wheel in a counter-clockwise direction while simultaneously rotating an associated one of the chuck tables in the counter-clockwise direction.

10. The grinding apparatus according to claim 9, wherein the holding surface of each of the chuck tables includes a center, and further wherein the holding surface of each of the chuck tables includes an upwardly convex conical surface having a vertex at the holding surface's center.

11. The grinding apparatus according to claim 10, wherein: a first spindle unit of the first grinding wheel has been adjusted to tilt such that one of two radial areas of the holding surface that are diametrically opposite each other across the center of the holding surface and that underlie the first grindstones lies parallel to the lower surfaces of the first grindstones; a second spindle unit of the second grinding wheel has been adjusted to tilt such that the other of the two radial areas of the holding surface that are diametrically opposite each other across the center of the holding surface and that underlie the second grindstones lies parallel to the lower surfaces of the second grindstones; and a third spindle unit of the third grinding wheel has been adjusted to tilt such that the one of two radial areas of the holding surface that are diametrically opposite each other across the center of the holding surface and that underlie the third grindstones lies parallel to the lower surfaces of the third grindstones.

12. The grinding apparatus according to claim 9, wherein: the first grindstones are each shaped as a rectangular parallelepiped; the second grindstones are each shaped as a rectangular parallelepiped; and the third grindstones are each shaped as a rectangular parallelepiped.

13. The grinding apparatus according to claim 9, wherein: the first grindstones include large abrasive grains; the second grindstones include middle-sized abrasive grains; and the third grindstones include small abrasive grains.

14. The grinding apparatus according to claim 9, wherein: the first grindstones are each shaped as a rectangular parallelepiped, and the first grindstones include large abrasive grains; the second grindstones are each shaped as a rectangular parallelepiped, and the second grindstones include middle-sized abrasive grains; and the third grindstones are each shaped as a rectangular parallelepiped, and the third grindstones include small abrasive grains.

15. The grinding apparatus according to claim 9, further comprising: a fourth grinding mechanism for grinding the wafer held on the holding surface of one of the chuck tables by keeping lower surfaces of fourth grindstones arranged in an annular array on a fourth grinding wheel in contact with a radial area of the wafer; a fourth grinding feed mechanism for grinding-feeding the fourth grinding mechanism in a grinding feed direction perpendicular to the holding surface of one of the chuck tables; and a fifth chuck table mounted on the turntable such that the at least four chuck tables comprises five chuck tables; wherein the first grinding feed mechanism includes a first column and a first holder configured and arranged for holding the first grinding mechanism, wherein the first holder is movable in the grinding feed direction with respect to the first column, and further wherein the first column includes a first curved portion between a pair of first posts, where the first holder is positioned within a first opening defined by the first curved portion; wherein the second grinding feed mechanism includes a second column and a second holder configured and arranged for holding the second grinding mechanism, wherein the second holder is movable in the grinding feed direction with respect to the second column, and further wherein the second column includes a second curved portion between a pair of second posts, where the second holder is positioned within a second opening defined by the second curved portion; wherein the third grinding feed mechanism includes a third column and a third holder configured and arranged for holding the third grinding mechanism, wherein the third holder is movable in the grinding feed direction with respect to the third column, and further wherein the third column includes a third curved portion between a pair of third posts, where the third holder is positioned within a third opening defined by the third curved portion; wherein the fourth grinding feed mechanism includes a fourth column and a fourth holder configured and arranged for holding the fourth grinding mechanism, wherein the fourth holder is movable in the grinding feed direction with respect to the fourth column, and further wherein the fourth column includes a fourth curved portion between a pair of fourth posts, where the fourth holder is positioned within a fourth opening defined by the fourth curved portion; and 13 wherein the first opening and the second opening face each other, and further wherein the third opening and the fourth opening face each other.

16. The grinding apparatus according to claim 9, further comprising: a fourth grinding mechanism for grinding the wafer held on the holding surface of one of the chuck tables by keeping lower surfaces of fourth grindstones arranged in an annular array on a fourth grinding wheel in contact with a radial area of the wafer; a fourth grinding feed mechanism for grinding-feeding the fourth grinding mechanism in a grinding feed direction perpendicular to the holding surface of one of the chuck tables; and a fifth chuck table mounted on the turntable such that the at least four chuck tables comprises five chuck tables; wherein the first grinding feed mechanism includes a first column and a first holder configured and arranged for holding the first grinding mechanism, wherein the first holder is movable in the grinding feed direction with respect to the first column, and further wherein the first column includes a first curved portion between a pair of first posts, where the first holder is positioned within a first opening defined by the first curved portion; wherein the second grinding feed mechanism includes a second column and a second holder configured and arranged for holding the second grinding mechanism, wherein the second holder is movable in the grinding feed direction with respect to the second column, and further wherein the second column includes a second curved portion between a pair of second posts, where the second holder is positioned within a second opening defined by the second curved portion; wherein the third grinding feed mechanism includes a third column and a third holder configured and arranged for holding the third grinding mechanism, wherein the third holder is movable in the grinding feed direction with respect to the third column, and further wherein the third column includes a third curved portion between a pair of third posts, where the third holder is positioned within a third opening defined by the third curved portion; wherein the fourth grinding feed mechanism includes a fourth column and a fourth holder configured and arranged for holding the fourth grinding mechanism, wherein the fourth holder is movable in the grinding feed direction with respect to the fourth column, and further wherein the fourth column includes a fourth curved portion between a pair of fourth posts, where the fourth holder is positioned within a fourth opening defined by the fourth curved portion; and wherein the first posts, the second posts, the third posts and the fourth posts all extend in radial directions towards the central axis of the turntable.

17. A method for grinding a wafer using a grinding apparatus that includes at least four chuck tables for holding respective wafers on holding surfaces thereof, a first grinding mechanism for grinding the wafer held on the holding surface of one of the chuck tables by keeping lower surfaces of first grindstones arranged in an annular array on a first grinding wheel in contact with a radial area of the wafer, a second grinding mechanism for grinding the wafer held on the holding surface of one of the chuck tables by keeping lower surfaces of second grindstones arranged in an annular array on a second grinding wheel in contact with a radial area of the wafer, a third grinding mechanism for grinding the wafer held on the holding surface of one of the chuck tables by keeping lower surfaces of third grindstones arranged in an annular array on a third grinding wheel in contact with a radial area of the wafer, a first grinding feed mechanism for grinding-feeding the first grinding mechanism in a grinding feed direction perpendicular to the holding surface of one of the chuck tables, a second grinding feed mechanism for grinding-feeding the second grinding mechanism in a grinding feed direction perpendicular to the holding surface of one of the chuck tables, a third grinding feed mechanism for grinding-feeding the third grinding mechanism in a grinding feed direction perpendicular to the holding surface of one of the chuck tables, and a turntable with the chuck tables mounted thereon, the turntable being rotatable about a central axis of the turntable for positioning the chuck tables respectively with respect to the first grindstones, the second grindstones, and the third grindstones, wherein the method comprises: producing a first ground mark on the wafer by grinding the wafer with the first grindstones; producing a second ground mark on the wafer by grinding the wafer with the second grindstones such that the second ground mark extends across the first ground mark, wherein the first ground mark is developed radially inwardly on the wafer by rotating the first grinding wheel in a first direction while simultaneously rotating an associated one of the chuck tables in a first direction and wherein the second ground mark is developed radially inwardly on the wafer by rotating the second grinding wheel in a second direction that is opposite of the first direction while simultaneously rotating an associated one of the chuck tables in the second direction, and producing a third ground mark on the wafer by grinding the wafer with the third grindstones such that the third ground mark extends across the second ground mark produced on the wafer by the second grindstones, wherein the third ground mark is developed radially inwardly on the wafer by rotating the third grinding wheel in the first direction while simultaneously rotating an associated one of the chuck tables in the first direction.

\* \* \* \* \*